United States Patent [19]

Schonauer et al.

[11] Patent Number: 5,662,769
[45] Date of Patent: Sep. 2, 1997

[54] CHEMICAL SOLUTIONS FOR REMOVING METAL-COMPOUND CONTAMINANTS FROM WAFERS AFTER CMP AND THE METHOD OF WAFER CLEANING

[75] Inventors: Diana M. Schonauer, San Jose; Steven C. Avanzino, Cupertino, both of Calif.

[73] Assignee: Advanced Micro Devices, Inc., Sunnyvale, Calif.

[21] Appl. No.: 391,812

[22] Filed: Feb. 21, 1995

[51] Int. Cl.⁶ ............................ H01L 21/00; C09K 13/00
[52] U.S. Cl. ............................ 438/633; 134/2; 134/3; 252/79.1; 252/79.3; 438/693; 438/906
[58] Field of Search ............................ 156/636.1; 134/2, 134/3; 252/79.1, 79.3

[56] References Cited

U.S. PATENT DOCUMENTS

| | | | |
|---|---|---|---|
| 3,889,753 | 6/1975 | Richardson | 166/307 |
| 4,090,563 | 5/1978 | Lybarger et al. | 166/307 |
| 5,340,370 | 8/1994 | Cadien et al. | 51/308 |
| 5,478,436 | 12/1995 | Winebarger et al. | 156/636.1 |
| 5,509,970 | 4/1996 | Shiramizu | 134/3 |

FOREIGN PATENT DOCUMENTS

| | | | |
|---|---|---|---|
| 0 401 147 A3 | 12/1990 | European Pat. Off. | H01L 21/306 |
| 0 496 605 A3 | 7/1992 | European Pat. Off. | H01L 21/306 |
| 3-242352 | 10/1991 | Japan . | |

OTHER PUBLICATIONS

Pak, "Impact of EDTA on junction and photolith qualities" Extended Abstracts, Oct. 1980, vol. 80, No. 2, pp. 1241–1243, see the whole document.

Kern, "Radiochemical study of semiconductor surface contamination," RCA Review, Jun. 1970, vol. 31, pp. 207–264, see p. 249, paragraph 2; table 6.

Kaufman et al, "Chemical-mechanical polishing for fabricating patterned W metal features as chip interconnects," Journal of the Electrochemical Society, vol. 138, No. 11, Nov. 1991.

Greer et al, "Process for removing wafer surface contaminants" IBM Technical Disclosure Bulletin, vol. 15, No. 8, Jan. 1973, p. 2358, see the whole document.

*Primary Examiner*—Thi Dang
*Attorney, Agent, or Firm*—Gerald M. Fisher

[57] ABSTRACT

A process and solution for cleaning Fe contaminants bound to a metallized semiconductor surface after CMP planarization. The solution comprises a PH buffered solution including hydrofluoric acid and a ligand selected from a group consisting of citrates and EDTA.

13 Claims, No Drawings

CHEMICAL SOLUTIONS FOR REMOVING METAL-COMPOUND CONTAMINANTS FROM WAFERS AFTER CMP AND THE METHOD OF WAFER CLEANING

BACKGROUND OF THE INVENTION

Polishing slurries currently used for planarization in the semiconductor industry are typically aqueous suspensions comprised of an abrasive (such as alumina), an organic dispersant, and a suitable oxidizing agent. This process is known as chemical-mechanical polishing (CMP). The oxidizing agent works to convert the metal surface to a more easily polishable metal oxide. Some oxidizing agents employed in commercially-available or proprietary slurries are metal compounds that are present in significant concentrations. Other chemicals added to slurries to improve dispersion or otherwise enhance performance often are metal-based. Sodium, potassium, and iron compounds are frequently used in slurry formulations, and significant amounts of these metal impurities can remain on the wafer after polishing and normal cleaning.

Currently, a typical cleaning process performed on wafers after metal plug polish processing is a 2-step, double-sided brush scrubbing with 2% $NH_4OH$. This is a reasonably effective cleaning process for particulate matter from the slurry, and it does significantly reduces the ionic and organic contaminants adhering to the wafer. However, surface-sensitive TXRF (Total-internal-reflectance X-Ray Fluorescence) analysis of wafers polished with an iron-containing slurry, and scrubbed with 2% $NH_4OH$, indicate that very high levels of Fe and Fe containing contaminants—ranging from 1.2–2.4 E14 atoms/cm$^2$—are bound at the wafer surface. This is roughly equivalent to 0.1 monolayer of Fe. In this instance other metallic impurities, notably K, Na, Ti, and Al, are detected at much lower levels (E11–E12 atoms/cm$^2$) by TXRF and SIMS.

After CMP, although generally the Fe contaminant is present at a layer in the device that is somewhat removed from the transistors at the Si surface, since iron is known to degrade gate oxides and to impair device characteristics, prudent steps should be taken to remove the Fe from the wafer after polishing. Consequently, there is a need to develop an additional (or alternate) cleaning process to remove Fe and other impurities from post CMP wafers.

SUMMARY OF THE INVENTION

It is an object of the invention to provide a process for cleaning metal compound contaminants remaining at or in the surface of a semiconductor wafer following CMP.

It is a further object that the cleaning process restore the wafer surface to the level of a metal compound contaminant concentration on the order of the concentration prior to CMP.

It is a still further object that the metal contaminants embedded below the wafer surface and chemical bound thereto as a result of CMP are removed by the cleaning process by aching a thin layer of surface oxides, i.e., 30A–50A from said surface of the wafer.

It is even a still further object that the cleaning process while etching the thin layer of surface oxides does not etch selected metal barrier films such as titanium.

It is a feature of this invention that the pH of the cleaning solution is controlled to be within the 5.8 to 6.1 range to maintain a large process window during which time the titanium metal barrier films are not removed.

It is a feature of this invention in connection with Fe compound contaminants that the cleaning solution contains either citrate ions or EDTA and HF.

DETAILED DESCRIPTION OF THE INVENTION

A number of criteria must be considered to establish an acceptable wafer cleaning process. First, the ideal cleaning process should reduce metal contaminants on the wafer to the level present before the polishing step. Second, the cleaning process should not increase the particle defect density on the wafer above that obtained by existing art. Third, the cleaning process and chemistry must be compatible with the materials exposed on the wafer surface after CMP. Fourth, a method of performing the cleaning process safely using commercially-available wafer fab tools is necessary. Fifth, the cleaning process should be low in cost.

For purposes of providing a detailed description of the invention, the invention is described in connection with chemical-mechanically polishing (CMP) of a wafer having tungsten lines and vias through silicon dioxide dielectric layers. The polishing slurry oxidizing agent is an iron compound.

After cleaning, the principal source of the iron remaining at the surface is the ferric salt solution used in the slurry, or the chemically-reduced, but unstable ferrous by-product of tungsten oxidation. The most likely chemical state of the iron surface contaminant is as a hydrated iron(III) oxide. As such, this material is strongly bound to the $SiO_2$ and $WO_3$ surfaces on the wafer, and not easily removed by mechanical means.

The applicants postulated that chemical agents could be used to dissolve or free the iron oxide from the wafer surface.

The chemical literature teaches that iron(III) readily forms stable complexes with many ligands. These are soluble ionic or neutral species in which an individual iron atom is surrounded by 6 strongly-bonded ligand atoms in octahedral coordination. We conducted a literature search for chemicals which form such complex-ions with $Fe^{3+}$. Of the dozens of compounds that form iron(III) complexes, ten chemical species (some chelating some monodentate) were selected as potential wafer cleaning agents for reasons of efficiency, materials compatibility, easy availability, safety, and cost. They are listed below in Table I along with the equilibrium constant for the ion-formation reaction. A larger formation constant implies greater thermodynamic stability of the complex-ion, and can be a measure of the driving force to remove an iron atom from the wafer surface by the complexing species.

TABLE I

| Chemical | | Complex-ion | Formation |
|---|---|---|---|
| Species | Formula | Formula | Constant |
| Ethylene diammine tetraacetic acid | EDTA$^{4-}$ | Fe(EDTA)$^-$ | $1.3 \times 10^{25}$ |
| Oxalate | $C_2O_4^{2-}$ | Fe(Ox)$_3^{3-}$ | $3.2 \times 10^{18}$ |
| Fluoride | F$^-$ | FeF$_5^{2-}$ | $3.2 \times 10^{14}$ |
| Succinate | $C_4H_4O_4^{2-}$ | Fe(Suc)$_2^{1-}$ | $1.0 \times 10^{13}$ |
| Citrate | $C_6H_5O_7^{3-}$ | Fe(Cit) | $3.2 \times 10^{11}$ |
| | $C_6H_5O_7^{2-}$ | Fe(HCit)$^+$ | $2.0 \times 10^{6}$ |
| Aspartate | $C_4H_5O_4N^{2-}$ | Fe(Asp)$^+$ | $2.5 \times 10^{11}$ |
| Glycine | $C_2H_5O_2N$ | Fe(Gly)$^{3+}$ | $1.0 \times 10^{10}$ |
| Malate | $C_4H_4O_5^{2-}$ | Fe(Mal)$^+$ | $1.3 \times 10^{7}$ |
| Tartrate | $C_4H_4O_6^{2-}$ | Fe(Tar)$^+$ | $3.2 \times 10^{6}$ |
| Chloride | Cl$^-$ | FeCl$_x$ | weak complexes ~5.5 |

Wafer cleaning experiments were performed testing six different chemical species from the above list. After tungsten polish with an iron-based slurry and $NH_4OH$ scrub treatment, wafers were immersed in 0.1M solutions of the chemicals for 5 min (19 deg C., all @ pH 8 except EDTA @ pH 2). The wafers were rinsed and dried, then analyzed by SIMS (Secondary Ion Mass Spectrometry) to measure levels of Fe, K, and Na relative to a control wafer that did not receive the chemical treatment. The most effective chemicals tested were citrate and EDTA—producing an 8× reduction in the level of Fe at the $SiO_2$ surface, a 2× reduction in potassium levels, and a ~30% reduction in sodium levels. Tartrate and glycine were less effective in reducing Fe (~2× reduction) and K (~40% reduction), but increased the surface Na (~4× increase). Oxalate and malate had no effect in reducing Fe, lowered K (~60% reduction), but increased Na (~4× increase). This experiment demonstrates that chemical complexing agents can effectively reduce the level of surface iron contamination after tungsten CMP, and that some chemical agents can reduce, to a lesser degree, Na and K contamination. Citrate and EDTA are the most effective chemicals.

While quite significant, an eight fold reduction can still leave ~2 E13 atoms/$cm^2$ of iron on the wafer. It has been established that wafers polished with non-iron-based polishing slurries for silicon dioxide films exhibit ~1–5 E11 atoms/cm2 of surface Fe, and that incoming wafers before polishing have <1 E11 atoms/cm2 of Fe.

Due to the mechanically abrasive nature of the CMP process, we also postulate that some fraction of the slurry Fe on the wafer becomes physically buried beneath the surface of the oxides, and it has not been exposed to the chemical cleaning agents that contact the solid-liquid interface.

For the above reason, we postulated that it would be desirable to modify the cleaning solution to chemically etch away the polished surface for a very shallow depth, while simultaneously complexing the Fe impurity, and other metal impurities. Hydrofluoric acid (HF) is a well-known chemical species for etching $SiO_2$ and other oxides. Consequently, we chose to evaluate citric acid/HF solutions and EDTA/HF solutions as post-CMP treatments, to improve the cleaning efficiency for metal contaminants. Solutions were prepared using stock chemicals of citric acid, EDTA, and hydrofluoric acid according to Table II. Tungsten polished wafers were soaked for 5 min as listed. Wafers were analyzed by SIMS and TXRF.

showed 1000× lower Fe levels than the existing W cleaning process. Residual Fe levels at 2 E11 atoms/$cm^2$ are attainable. This is as low as the $SiO_2$ polish process that uses iron-free slurry.

Although some are quite effective in removing metal contaminants, the solutions of Table II fail an important criteria for a successful post W CMP wafer clean. Unfortunately, the HF-containing solutions tested were incompatible with titanium, a metal film used as the W plug liner which is exposed on the wafer surface. Rapid chemical etching of Ti by HF during the 5 minute cleaning process makes these solutions unacceptable for use on device wafers.

Consequently, it is desirable to further modify the cleaning solution to be compatible with the polished Ti films remaining on the wafer after W CMP. The method to accomplish this was discovered with the observation that the etching of Ti films in the aforementioned citric acid/HF cleaning solution was extremely non-linear with respect to soak time. Etching of the metal film did not occur at all for several minutes, then all of the film was etched away in <1 min. We believe the mechanism governing this behavior involves the slow continuous etching of a native oxide ($TiO_2$) on the surface of the metal, followed by the rapid dissolution of metallic Ti, starting from that point in time when the native titanium oxide is gone. This would explain the apparent "incubation time" observed during soaking before the titanium metal is rapidly etched. We demonstrate that it is possible to reduce the native oxide etch rate, and thereby lengthen the incubation time before Ti metal etching occurs, by adjusting the pH of the solutions. This can also be adjusted by addition of standard buffering solutions. It is necessary to achieve a stable value of pH, which could include aging time. This data is shown in Table III below. Implicit in this procedure is the understanding that the active chemical species in these solutions responsible for metal-complex formation are the citrate anions, and for $SiO_2$, $TiO_2$, and Ti etching are molecular HF and $HF_2^-$ as well as $H^+$. The concentrations of these active species are governed by their aqueous chemical equilibria with the compounds used to formulate the solutions.

TABLE II

| Solution | Formal Molar Concentration | | | $SiO_2$ Etched | % Remaining | | |
| --- | --- | --- | --- | --- | --- | --- | --- |
| | Citric acid | EDTA | HF | | Fe | K | Na |
| Citric/HF | 0.1M | — | 0.049M | 76 A | 0.1 | 1 | <1 |
| EDTA/HF | — | 0.0017M | 0.056M | 67 A | — | 2 | 5 |
| Citric | 0.1M | — | — | — | 7 | 47 | 100 |
| EDTA | — | 0.0017M | — | — | — | 47 | 500 |
| $H_2O$/HF + Citric | 0.1M | — | 0.028M | 50 A | — | 4 | 10 |
| $H_2O$/HF + EDTA | — | 0.0017M | 0.028M | 50 A | — | 3 | 100 |

The results in Table II demonstrate the following:

1) Very thin amounts of $SiO_2$ can be etched from the wafer surface with very-dilute-HF containing solutions.
2) The data shows that further reductions in Fe, K, and Na are possible with citric/HF and EDTA/HF solutions vs. citric or EDTA solutions only. Also, these combined HF/chelating agent solutions are more effective than sequential treatments with HF then chelating agent.
3) By the quantitative TXRF analytical technique for absolute impurity levels, citric/HF cleaning solution

TABLE III

| Solution | pH | Formal Molar Concentration | | | | Ti Etching Begins After | $SiO_2$ Etched (5 min) |
| --- | --- | --- | --- | --- | --- | --- | --- |
| | | Citric acid | $NH_4F$ | $HNO_3$ | $NH_3$ | | |
| Fluoride | ~0 | — | 0.027 | 1.03 | — | 1.8 min | 16 A |
| Fluoride | 2.7 | — | 0.027 | 0.035 | — | 2.0 min | 32 A |

TABLE III-continued

| Solution | pH | Formal Molar Concentration | | | | Ti Etching Begins After | SiO$_2$ Etched (5 min) |
| | | Citric acid | NH$_4$F | HNO$_3$ | NH$_3$ | | |
|---|---|---|---|---|---|---|---|
| Fluoride | 3.8 | — | 0.027 | 0.004 | — | 11.5 min | 11 A |
| Fluoride | 6.8 | — | 0.027 | — | — | >15 min | <10 A |
| Citrate/Fluoride | 5.9 | 0.1 | 0.18 | — | 0.14 | — | <10 A |
| Citrate/Fluoride | 5.9 | 0.1 | 0.35 | — | 0.12 | — | 33 A |
| Citrate/Fluoride | 5.9 | 0.1 | 0.36 | — | — | — | 60 A |
| Citrate/Fluoride | 5.9 | 0.1 | 0.42 | — | 0.10 | — | 160 A |
| Citrate/Fluoride | 6.3 | 0.1 | 1.3 | — | 0.11 | — | 309 A |
| Citrate/Fluoride | 8.8 | 0.1 | 1.3 | — | 0.23 | — | <10 A |

In the course of experimenting with solutions containing citrate compounds and fluoride compounds, we encountered a number of anamolous results pertaining to the actual pH of the solutions vs pH expected from equilibrium calculations. The stability of pH was poor, and etch rate data fluctuated. It was surmised that the solutions were not in equilibrium when first mixed, and that the time required to reach equilibrium was quite long. It was discovered this phenomenon could be overcome by attention to the formulation process, by only mixing together well diluted solutions of each individual component. In this way chemical equilibrium is reached rapidly, and the solution's pH is close to the calculated value, reproducible, and stable.

From the experiments shown in Table III we developed a refined formulation for the cleaning solution based on a mixture of citrates and NH$_4$F. Since both HF concentration and solution pH are critical for SiO2 and Ti etch control, we have chosen to use a mixture of two readily available forms of citrate, triammonium citrate and diammonium hydrogen citrate, that when mixed together buffer the solution to a constant pH of 5.9–6.1. This is an optimal pH to control SiO$_2$ and Ti etch characteristics for a W CMP clean, when the easily controlled, proper amount of NH$_4$F is employed. The six formulations listed in Table IV demonstrate cleaning solutions that exhibit well-behaved results in their cleaning and compatibility properties. Solution C is the preferred embodiment for a W CMP clean.

preferred embodiment Solution C produced low defect density levels totally equivalent to the reference process. Hence, this solution meets the defect density criteria.

We have shown that metal-compound surface contaminants remaining on wafers after W CMP can be removed with chemicals that strongly bond to the metal atoms to produce stable metal-ion complexes in solution, and specifically, that Fe, K, and Na contaminants can be removed from the wafer surface in this manner.

We have demonstrated specifically, that citrate ion solutions and EDTA solutions are especially suited for this purpose.

We believe that sub-surface Fe, K, and Na contaminants introduced into the SiO$_2$ and WO$_3$ oxides by the CMP processing, and accounting for approximately 5%–20% of the total metal contamination, can be removed from the wafer by a cleaning solution containing both a complexing chemical, such as citrate ion or EDTA, and carefully controlled concentrations of hydrofluoric acid (HF)—the purpose of which is to slowly etch the outer 30A–50A of oxides on the wafer during the cleaning step, exposing and releasing all buried contaminants from beneath the surface.

We have demonstrated that an aqueous solution that is formulated to be 0.10 molar in ionic citrates and 0.53 molar in fluoride ion at pH 5.9–6.1, when applied to the wafer surface for 5 minutes at 19 C., is shown to simultaneously etch 30A–50A of SiO$_2$ and complex all of the Fe, K, and Na added to the wafer by the polishing process. More specifically, an aqueous solution that is made 0.0435 formal (10.58 gm/l) in triammonium citrate (NH$_4$)$_3$(C$_6$H$_5$O$_7$), 0.0565 formal (12.78 gm/l) in diammonium hydrogen citrate (NH$_4$)$_2$H(C$_6$H$_5$O$_7$), and 0.53 formal (19.68 gm/l) in ammonium fluoride NH$_4$F is naturally buffered to pH 5.9–6.1, since at equilibrium it contains equimolar concentrations of the weak acid anions Cit$^{3-}$ and HCit$^{2-}$. Furthermore, the stable pH 5.9–6.1 of this buffered solution produces an equilibrium concentration of 0.00063 molar HF, by hydrolysis of the free fluoride ion added. This reproducibly low HF concentration allows for the controlled etching of oxides on the wafer surface. We have also discovered that the equilibrium of species in the solution is more rapidly achieved by the initial dissolution of the individual citrate salts and fluoride salt in 3 equal volumes of water, then combining the 3 volumes to make the final solution.

It is claimed that the inventive solutions have the additional beneficial effect of being fully compatible for use with exposed Ti barrier films present on the wafer surface after tungsten CMP processing. When used to clean wafers, these

TABLE IV

| Sol'n | Formal Molar Concentration | | | Calc. | | Ti Etching Begins After | SiO$_2$ Etched (5 min) | % Remaining | | |
| | (NH$_4$)$_3$Cit | (NH$_4$)$_2$HCit | NH$_4$F | [HF] | pH | | | Fe | K | Na |
|---|---|---|---|---|---|---|---|---|---|---|
| A | 0.0413 | 0.0587 | 0.820 | 9.4E-4 | 6.3 | 8.0 min | 78 A | — | — | — |
| B | 0.0419 | 0.0581 | 0.698 | 8.2E-4 | 6.2 | 10.2 min | 68 A | 0.07 | — | <1 |
| C | 0.0435 | 0.0565 | 0.532 | 6.3E-4 | 6.1 | 19.2 min | 35 A | 0.14 | 3 | 5 |
| D | 0.0461 | 0.0539 | 0.407 | 4.6E-4 | 6.1 | >>15 min* | 20 A | — | — | — |
| E | 0.0458 | 0.0542 | 0.263 | 3.1E-4 | 5.9 | >80 min* | 10 A | 0.71 | 50 | 60 |
| F | 0.0464 | 0.0536 | 0.0505 | 0.6E-4 | 5.8 | >>20 min* | 1 A | — | — | — |

*discontinued data collection

Another important criteria for a useful post W CMP cleaning process is the particle defect density remaining on the wafers after the clean. A valid reference point can be taken as the defect density attained using a double-sided brush scrubber with 2% NH$_4$OH. We demonstrated that the solutions do not chemically etch the cylindrical Ti layer surrounding each W via plug. This is an essential criteria for a post-CMP clean, because a chemical which attacks the plug liner will etch recessed cavities into the wafer, which are deleterious to subsequent process steps and circuit reliability. The preferred-embodiment chemical solution was specifically developed to controllably etch 30A–50A of $SiO_2$ well before all of the thin native oxide ($TiO_2$) protecting the Ti metal was removed. The Ti metal remains unaffected for approximately 18 min, after which rapid etching of Ti occurs. However, the wafer cleaning process with $SiO_2$ removal is preferably completed in 5 min. We discovered that the solution's HF concentration and pH are critical factors governing relative $SiO_2$ vs $TiO_2$ etch behavior, and this lead us to formulate the solution with the composition chosen. The chemicals and recipe specified allow for a wide manufacturing tolerance, yet a tight compositional control, of the solution.

We believe that the effectiveness of this cleaning process in removing metal contaminants is governed by a) the composition of the solution, b) the uniform application of the solution to the wafers, c) the temperature of the wafers and solution, d) the duration of the solution's application, and e) the effective rinsing of the solution off the wafers by pure water. With this in mind, any suitable means used to carry out this wet cleaning process is acceptable. This cleaning process is possible by immersing the wafers in a bath of the chemical, with or without megasonic agitation, followed by rinsing. This clean process is possible using so-called spray-acid processing tools common in the semiconductor industry. This clean process is possible using wafer brush-scrubbing tools common in the industry. This clean process is possible by employing the solution in an appropriate cleaning station built into the wafer polishing tool. Our invention is not limited to the embodiments described herein and the scope of our invention should be determined by the claims. With this in view,

We claim:

1. In a process for manufacturing semiconductor integrated circuits comprising:

forming circuits on the surface of a semiconductor wafer by photolithographic processes, including use of W metal layers bound to said surface as portions of said circuits;

planarizing said surface by W-CMP, wherein said W-CMP includes chemical-mechanical scrubbing of said wafer with an abrasive slurry including an Fe oxidant;

cleaning Fe contaminants remaining bound to said semiconductor surface after adequate surface planarization is achieved without damaging said W layers, said cleaning step including applying a pH stable solution to said wafer to chemically bind to said Fe and to produce Fe-ion complexes in solution;

wherein one ingredient of said solution is selected from a ligand group consisting of citrates and EDTA.

2. The process of claim 1 wherein another ingredient of said solution includes HF.

3. The process of claim 2 wherein said pH value of said pH stable solution is adjusted to be in the range from 5.8 to 6.3.

4. In a process for manufacturing semiconductor integrated circuits comprising:

forming circuits on the surface of said semiconductor wafer by photolithographic processes, including use of W and Ti metal layers as portions of said circuits;

planarizing said surface by W-CMP, wherein said W-CMP includes chemical-mechanical scrubbing of said wafer with an abrasive slurry including an Fe oxidant;

cleaning Fe contaminants remaining bound to said metallized semiconductor surface, after adequate surface planarization is achieved, without damaging said W and Ti layers, said cleaning step including applying a pH stable etching solution to said wafer to produce metal-ion complexes in solution; and discontinuing said cleaning step before etching said titanium layer, wherein one ingredient of said pH stable aching solution is selected from a pH buffered ligand group consisting of citrates and EDTA.

5. The process of claim 4 wherein another ingredient of said pH stable solution includes HF.

6. The process of claim 5 wherein said pH value of said pH stable solution is adjusted to be in the range from 5.8 to 6.3.

7. The process of claim 6 wherein the ingredients of said pH stable solution are diluted and aged before mixing together.

8. In a process for manufacturing semiconductor integrated circuits comprising:

forming circuits on the surface of a semiconductor wafer by photolithographic processes, including use of W metal layers as portions of said circuits, said metal layers being bound to said semiconductor wafer surface;

planarizing said surface by W-CMP, wherein said W-CMP includes chemical-mechanical scrubbing of said wafer with an abrasive slurry which slurry includes Fe as an oxidant;

cleaning metal contaminants including Fe, Na and K remaining bound to said semiconductor wafer surface after adequate surface planarization is achieved without damaging said W layers, said cleaning step including applying a pH stable solution to said wafer to chemically bind to said metal contaminants and to produce metal-ion complexes in solution;

wherein the ingredients of said solution comprise trivalent citrate ions, divalent hydrogen citrate ions, and fluoride ions.

9. The process of claim 8 wherein said pH value of said pH stable solution is adjusted to be in the range from 5.8 to 6.3, and a further ingredient is ammonium ions.

10. A semiconductor wafer cleaning material comprising:

a pH buffered solution including $NH_4F$ and including a ligand wherein said ligand is a citrate mixture of triammonium citrate and diammonium hydrogen citrate.

11. A semiconductor wafer cleaning material comprising:

a pH buffered solution including a fluorine ion and including a ligand wherein said ligand is a citrate mixture of triammonium citrate and diammonium hydrogen citrate.

12. A semiconductor wafer cleaning material comprising:

a pH buffered solution including hydrofluoric acid and including a ligand wherein said ligand is a citrate mixture of triammonium citrate and diammonium hydrogen citrate, said solution further including ammonium.

13. A semiconductor wafer cleaning material comprising:

a pH buffered aqueous solution including ammonium ions and including a ligand having trivalent citrate ions, divalent hydrogen citrate ions and fluoride ions, wherein said pH is in the range 5.8 to 6.3.

* * * * *